(12) United States Patent
Tu

(10) Patent No.: US 6,867,129 B2
(45) Date of Patent: Mar. 15, 2005

(54) METHOD OF IMPROVING THE TOP PLATE ELECTRODE STRESS INDUCTING VOIDS FOR 1T-RAM PROCESS

(75) Inventor: Kuo-Chi Tu, Hsin-Chu (TW)

(73) Assignee: Taiwan Semiconductor Manufacturing Company, Hsinchu (TW)

( * ) Notice: Subject to any disclaimer, the term of this patent is extended or adjusted under 35 U.S.C. 154(b) by 0 days.

(21) Appl. No.: 10/618,793

(22) Filed: Jul. 15, 2003

(65) Prior Publication Data

US 2005/0012132 A1 Jan. 20, 2005

(51) Int. Cl.[7] .......................................... H01L 21/4763
(52) U.S. Cl. ...................................................... 438/636
(58) Field of Search ........................................ 438/636

(56) References Cited

U.S. PATENT DOCUMENTS

| | | | |
|---|---|---|---|
| 5,503,882 A | 4/1996 | Dawson | 427/579 |
| 5,583,077 A | 12/1996 | Wang et al. | 437/240 |
| 5,883,001 A | 3/1999 | Jin et al. | 438/624 |
| 6,136,688 A | 10/2000 | Lin et al. | 438/624 |
| 6,221,794 B1 | 4/2001 | Pangrle et al. | 438/792 |
| 6,287,962 B1 | 9/2001 | Lin | 438/638 |
| 6,414,376 B1 | 7/2002 | Thakur et al. | 257/640 |
| 6,468,855 B2 | 10/2002 | Leung et al. | 438/239 |

Primary Examiner—David A. Zarneke
(74) Attorney, Agent, or Firm—Thomas, Kayden, Horstemeyer & Risley (57) ABSTRACT

A method for fabricating a capacitor with overlying transistor without stress-induced voids is described. A capacitor stack is provided overlying a substrate. A stress-balancing dielectric layer is deposited overlying the stack. An anti-reflective coating (ARC) layer is deposited overlying the stress-balancing layer. The stack is patterned to form the capacitors. Gate transistors are formed overlying the capacitors wherein the stress-balancing layer prevents formation of stress-induced voids during the thermal processes involved in forming the gate transistors.

17 Claims, 7 Drawing Sheets

METHOD OF IMPROVING THE TOP PLATE ELECTRODE STRESS INDUCTING VOIDS FOR 1T-RAM PROCESS

BACKGROUND OF THE INVENTION (1) Field of the Invention

The present invention relates to methods of fabricating embedded memory devices, and more particularly, to methods of fabricating an embedded memory device with a stress balance layer so that formation of voids is prevented.

(2) Description of the Prior Art

SRAM cells in the past have been fabricated using six transistors, usually comprises of four N-channel metal oxide semiconductor field effect transistor (MOSFET) devices and two P-channel MOSFET devices. However, to reduce processing costs, the semiconductor industry has been attempting to fabricate smaller chips, where the smaller chips still offer device densities equal to or greater than the counterpart larger semiconductor chips. The attainment of a large number of smaller semiconductor chips on a specific size starting substrate allows the processing cost of a specific chip to be reduced. However, the use of smaller chips for SRAM technology creates problems when attempting to place six transistors on the smaller semiconductor chip. Therefore, SRAM designs have focused on one transistor, 1T-RAM cells, comprised of a single MOSFET device and a capacitor structure. This configuration, featuring a single transistor and a single capacitor, provides the same function as the six transistor design, but requiring less space and, thus, fulfilling the objective of constructing smaller semiconductor chips.

Due to continued improvement in process integration, it is the present trend of the semiconductor industry to fabricate semiconductor integrated circuits that integrate both a memory cell array and high-speed logic circuit elements onto a single chip to form an embedded memory (such as embedded DRAM, embedded 1T-SRAM). The embedded memory simultaneously combines the memory arrays and logic circuits to greatly reduce the circuit area and to increase signal processing speed. For the 1T-RAM process, the capacitor's process needs to complete before the logic process and to be fully compatible with the logic process. Meanwhile, in order to scale down the cell size, having a passing gate overlap the capacitor is necessary in the present design. Because the capacitor's process is finished before the logic process completes, the capacitor will suffer high thermal stress from gate oxide growth, source/drain implantation, and salicide high temperature anneal process. These high thermal annealings will induce voids between the top plate electrode and the top plate electrode's antiflective coating (ARC) layer. The voids will result in a gate to gate short after the transistor gate patterning.

A number of patents address the problem of stress. U.S. Pat. No. 6,136,688 to Lin et al shows a high compressive stress oxide layer to eliminate cracks in a subsequently deposited tensile stress layer such as SiON. U.S. Pat. No. 6,414,376 to Thakur et al discloses a silicon-rich SiN layer that relieves stress in a SiN layer. U.S. Pat. No. 5,883,001 to Jin et al shows a PE-SiON or SiN layer having compressive stress with an overlying PSG layer having tensile stress as a stress buffer. U.S. Pat. No. 5,503,882 to Dawson describes a PECVD oxide layer under a TEOS oxide layer where the compressive stress of the PECVD oxide layer offsets the TEOS layer's tensile stress. However, these patents do not deal with the 1T-RAM process, especially buried capacitors. The buried capacitor has a rough topography that can easily induce high stress. The buried capacitor must be formed before the gate transistor and salicide processes which then produce high thermal stress cycling.

U.S. Pat. No. 6,221,794 to Pangrle et al teaches annealing before interlayer dielectric deposition to avoid stress-induced voids. U.S. Pat. No. 5,583,077 to Wang et al discloses that compressive stress appears in a PSG layer if the layer is exposed to humidity for a time before a SiN layer is deposited over it. U.S. Pat. No. 6,468,855 to Leung et al describes stress avoidance by performing high thermal cycles prior to P+/N+shallow junction formation and salicidation. U.S. Pat. No. 6,287,962 to Lin describes a graded SNO layer where the top of the layer provides an ARC function.

SUMMARY OF THE INVENTION

Accordingly, it is a primary object of the invention to provide an effective and very manufacturable process for capacitor with overlying transistor.

Another object of the present invention is to provide a process for fabricating a capacitor with overlying transistor wherein stress-induced voids are eliminated.

Yet another object of the present invention is to provide a process for fabricating a capacitor with overlying transistor wherein stress-induced voids are eliminated by the presence of a stress-balancing layer between the top electrode and the ARC layer.

A further object is to provide a 1T-RAM device without stress-induced voids.

A still further object is to provide a method of fabricating a 1T-RAM device without stress-induced voids.

In accordance with the objects of this invention, a method for fabricating a capacitor with overlying transistor without stress-induced voids is achieved. A capacitor stack is provided overlying a substrate. A stress-balancing dielectric layer is deposited overlying the stack. An anti-reflective coating (ARC) layer is deposited overlying the stress-balancing layer. The stack is patterned to form the capacitors. Gate transistors are formed overlying the capacitors wherein the stress-balancing layer prevents formation of stress-induced voids during the thermal processes involved in forming the gate transistors.

Also in accordance with the objects of the invention, a 1T-RAM device without stress-induced voids is achieved. The device comprises a bottom electrode of a capacitor formed lining trenches within shallow trench isolation regions within a substrate, a capacitor dielectric layer overlying the bottom electrode, and a top electrode layer overlying the capacitor dielectric layer within and overlying the shallow trench isolation regions. A stress-balancing dielectric layer overlies the top electrode of the capacitor. An anti-reflective coating (ARC) layer overlies the stress-balancing layer. A gate oxide layer overlies the substrate. Transistor gates overlie the gate oxide layer and the ARC layer over the capacitor.

BRIEF DESCRIPTION OF THE DRAWINGS

In the following drawings forming a material part of this description, there is shown.

DESCRIPTION OF THE PREFERRED EMBODIMENTS

The process of the present invention provides a method for adding a stress balancing dielectric layer between the top electrode and the ARC layer overlying the top electrode that can eliminate the formation of voids in subsequent high temperature logic processes. The process of the present invention is shown in an embedded 1T-RAM application. It will be understood by those skilled in the art that the invention is not limited to this application, but can be extended and applied to other applications in which it is desired to balance the stress of an ARC or other layer. For example, DRAM or SRAM processes could be used.

Figure 1:
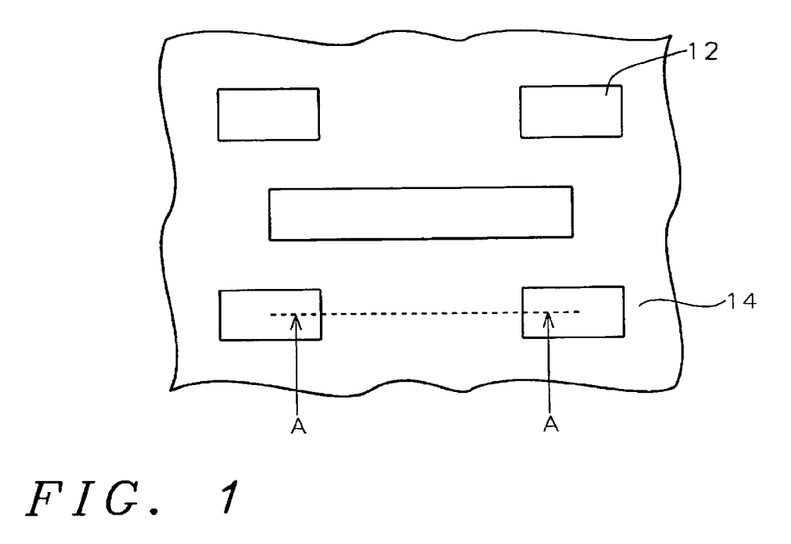
FIGS. 1, 3, 7, and 9 are top views of a preferred embodiment of the present invention.
Figure 2:
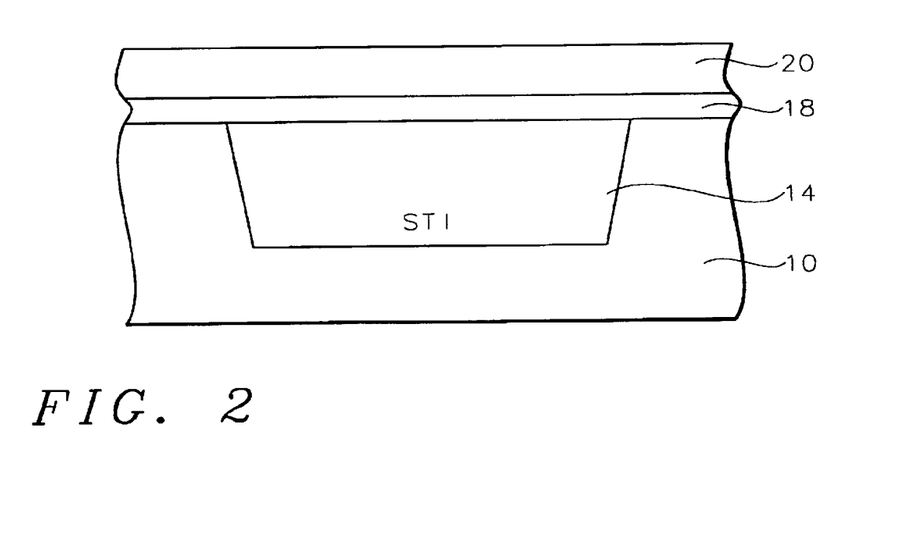
FIG. 2 is a cross-sectional representation of view A—A of FIG. 1.

The process of the present invention will be described with reference to the figures in the fabrication of am embedded 1T-SRAM device. Referring now more particularly to FIGS. 1 and 2, there is shown a partially completed integrated circuit device. The semiconductor substrate 10 is preferably composed of silicon having a (100) crystallographic orientation. Shallow trench isolation (STI) regions 14 are formed within the substrate 10 to separate active regions. FIG. 1 is a top view showing active regions 12 separated by STI regions 14. FIG. 2 is a cross-section of view 2—2 of FIG. 1. N-wells and/or P-wells, not shown, are formed within the substrate as is conventional in the art. Now a pad oxide layer 18 is deposited over the surface of the substrate to a thickness of between about 50 and 300 Angstroms. Next, a silicon nitride layer 20 is deposited over the oxide layer 18. This layer is deposited by plasma-enhanced chemical vapor deposition (PECVD) or low pressure chemical vapor deposition (LPCVD) to a thickness of between about 50 and 3000 Angstroms.

Figure 3:
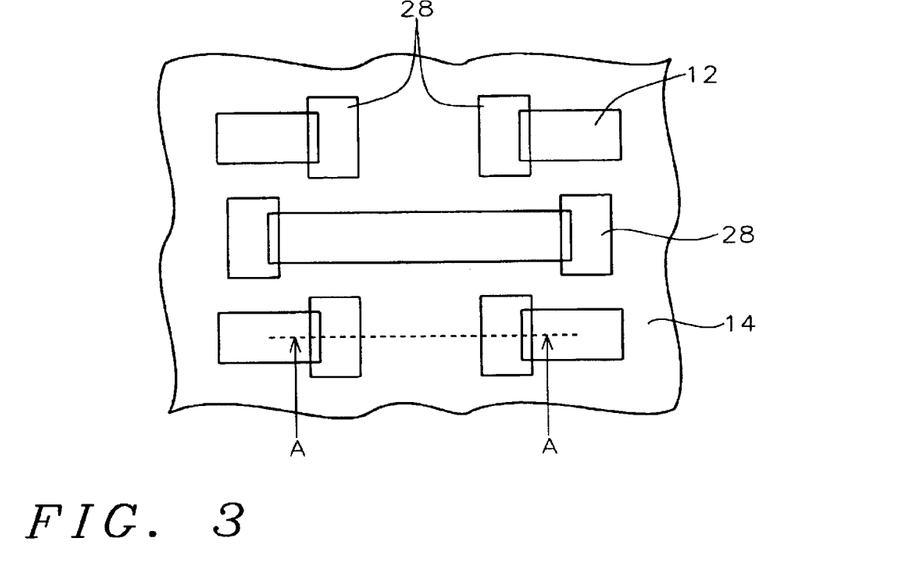
Figure 4:
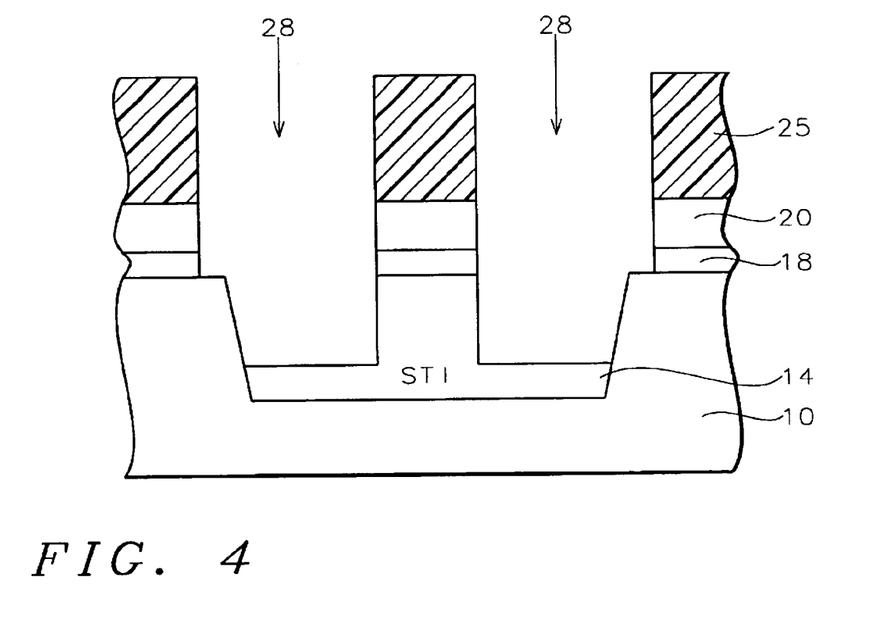
FIG. 4 through 6 are cross-sectional representations of view A—A of FIG. 3.

Referring now to FIGS. 3 and 4, a layer of photoresist 25 is coated over the wafer and patterned to form a mask leaving openings where capacitor trenches are to be etched into the STI regions. The STI region is etched where it is not covered by the photoresist mask 25 to form trenches 28 as shown in top view in FIG. 3 and in cross-section in FIG. 4.

Figure 5:
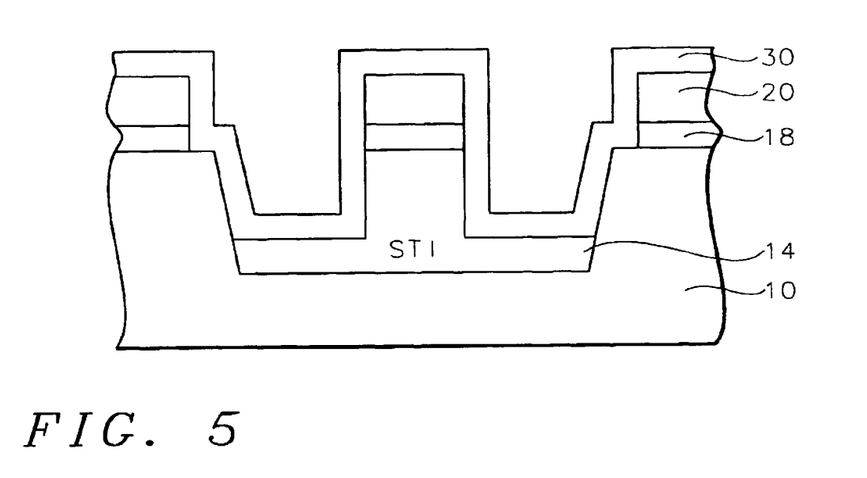

A conducting layer 30 is deposited over the substrate and within the trenches 28, as shown in FIG. 5. Preferably, the conducting layer 30 is polysilicon deposited by low pressure chemical vapor deposition (LPCVD) to a thickness of between about 100 and 3000 Angstroms.

Figure 6:
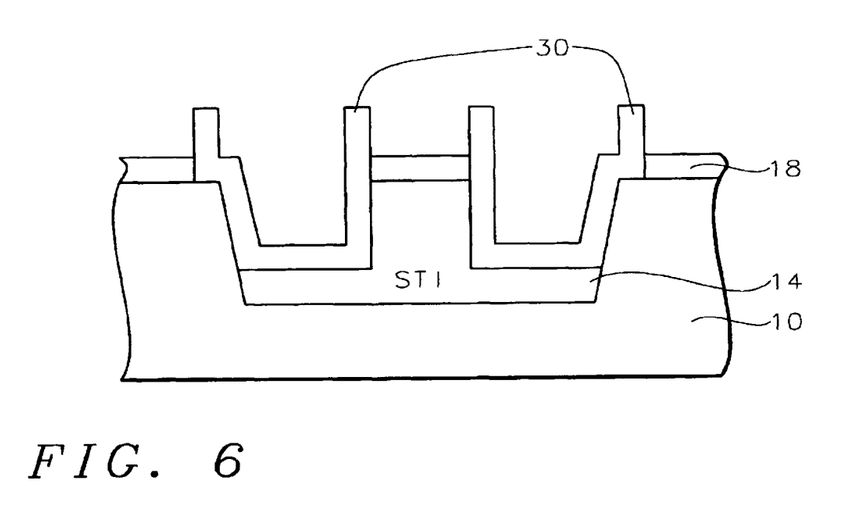

Next, as illustrated in FIG. 6, the conducting layer 30 is etched back or polished back by chemical mechanical polishing (CMP), for example, to form the bottom electrodes of capacitors. The silicon nitride layer 20 serves as an etch stop or polish stop layer. Then the silicon nitride layer 20 is removed to stop on the pad oxide layer 18.

Figure 7:
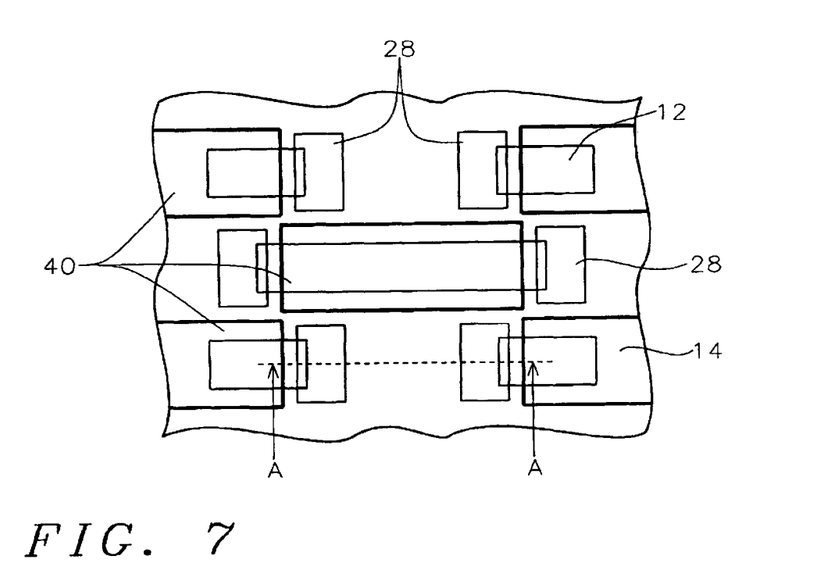
Figure 8:
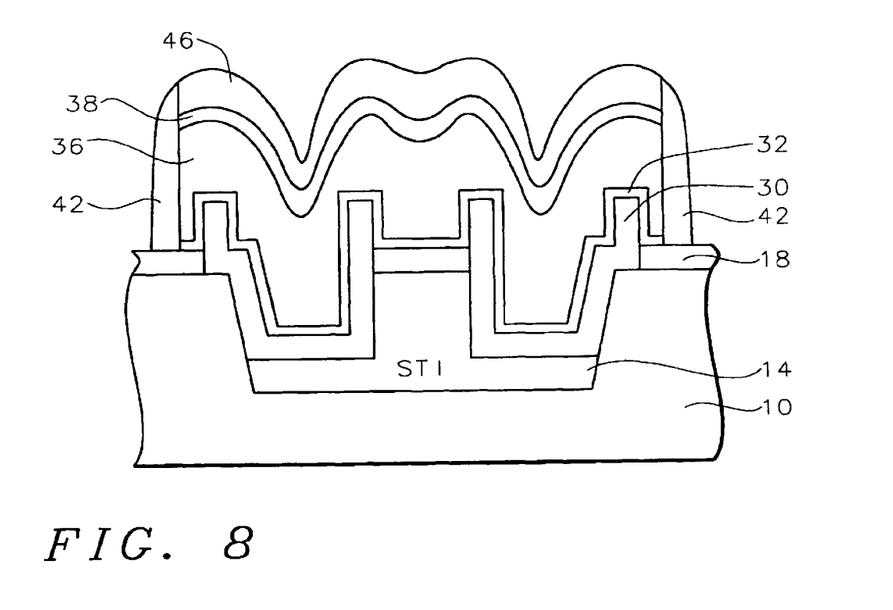
FIG. 8 is a cross-sectional representation of view A—A of FIG. 7.

Referring to FIG. 8, the capacitor formation is completed. A capacitor dielectric layer 32 is conformally deposited over the bottom electrode and the pad oxide layer. For example, the capacitor dielectric layer may comprise silicon nitride and silicon oxide having a thickness of between about 20 and 100 Angstroms. Now a second conducting layer 36 is deposited over the capacitor dielectric layer 32 to form the top electrode, shown in cross-section in FIG. 8 and in top view in FIG. 7.

Now, the capacitor top electrode is to be patterned to complete capacitor formation. Thus, an antireflective coating (ARC) layer will be deposited over the top electrode. The ARC layer also serves as an isolation layer between the top electrode and the gate transistors to be formed subsequently.

Figure 9:
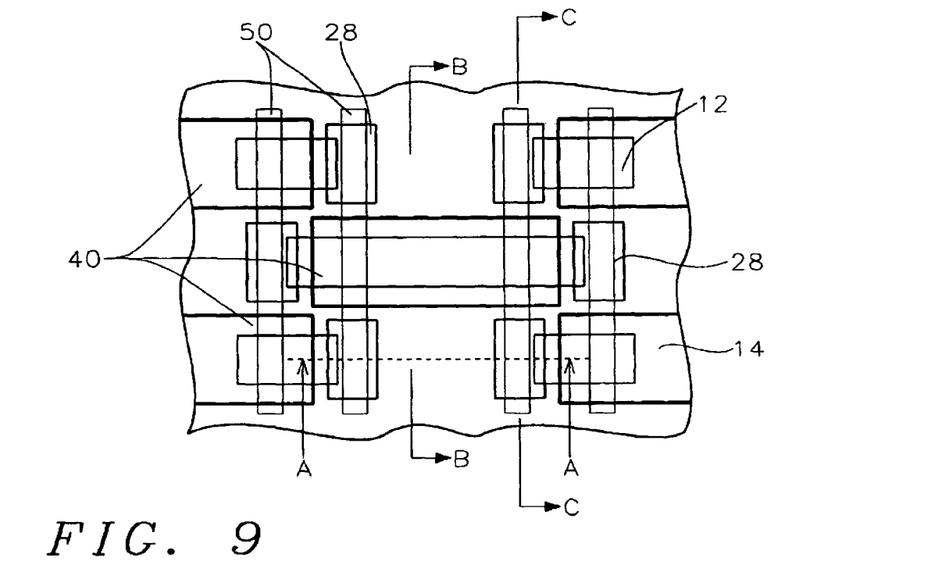
Figure 10:
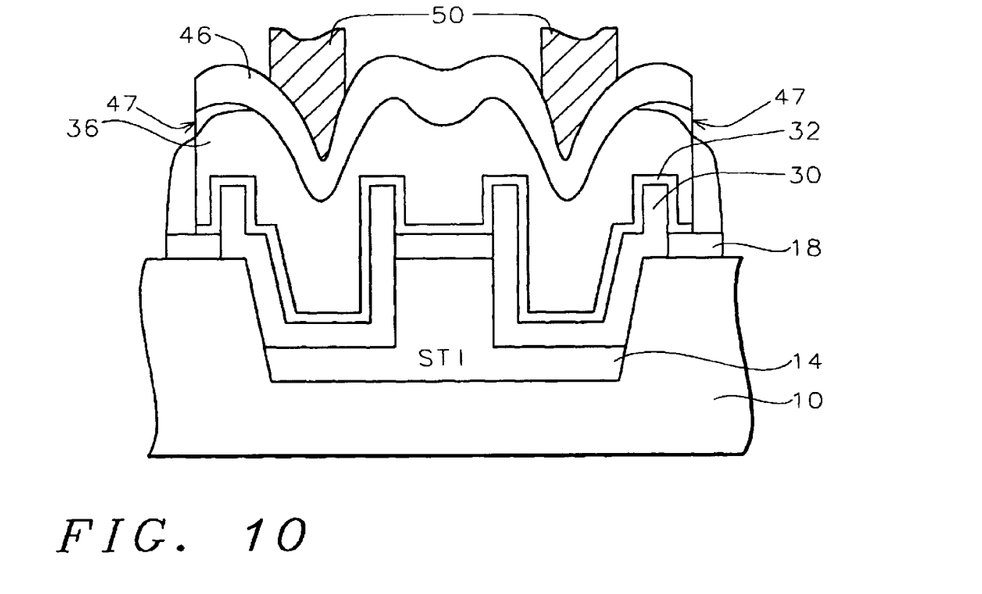
FIG. 10 is a cross-sectional representation of view A—A of FIG. 9 showing stress-induced voids that are eliminated by the process of the invention.

FIG. 9 shows a top view of the transistor gates 50. FIG. 10 shows the cross-section of view A—A, including ARC layer 46 and gates 50. FIG. 10 shows voids that can appear if the key stress-balancing layer of the present invention is not employed. Generally, gate oxide growth and source/drain implantation high temperature activation are high thermal expansion processes which result in stress-induced voids 47 between the top plate electrode 36 and the top plate ARC 46. After gate patterning, these voids 47 will lead to gate to gate or gate to top plate electrode shorts.

The process of the present invention prevents these stress-induced voids by adding a new inter-dielectric layer 38 between the top electrode 36 and the top electrode's ARC layer 46. This new layer balances the stress in the ARC layer to eliminate formation of voids. Referring again to FIG. 8, the new stress balancing layer 38 is shown underlying the ARC layer 46. PE-CVD SiON is typically used as the ARC layer. This material generally is a tensile stress material. Therefore, in order to balance the stress in the ARC layer, the new layer must be a compressive stress material. For example, the balance stress layer 38 may be an oxide, silicon nitride, or silicon oxynitride. For example, a PE-CVD oxide layer of about 150 Angstroms can have stress greater than $-2.0 \text{ E} -9 \text{ dynes/cm}^2$.

Other materials can be used for the ARC layer. It is possible that some ARC materials do no result in a high stress effect. However, if the ARC material will induce high stress during thermal cycling, either tensile or compressive stress, a balancing or stress releasing layer must be used. The stress-balancing layer 38 must be chosen so as to balance out the stress in the overlying ARC layer.

Now the ARC layer 46 is deposited overlying the stress-balancing layer 38. The ARC layer 46, stress-balancing layer 38, top electrode 36, and capacitor dielectric 32 are patterned to complete formation of the capacitors. Dielectric spacers 42 are formed on the sidewalls of the top electrode stack.

Figure 11:
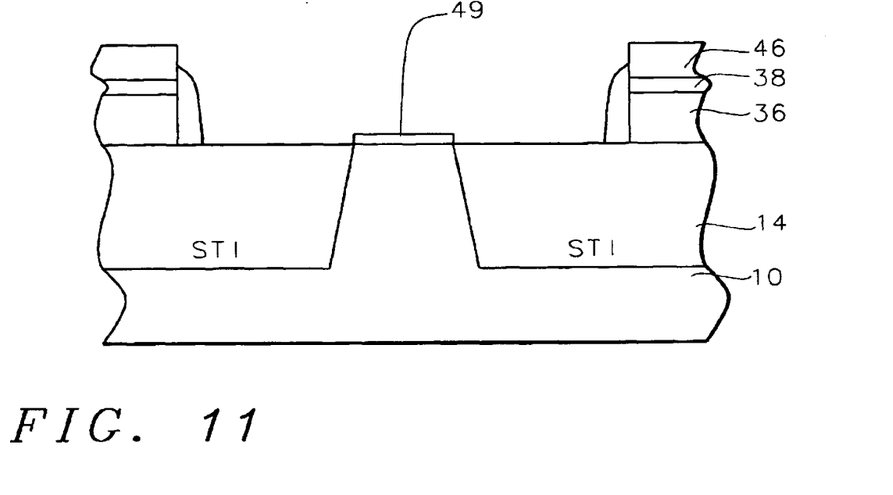
FIG. 11 is a cross-sectional representation of view B—B showing the elimination of stress-induced voids in a preferred embodiment of the present invention.
Figure 12:
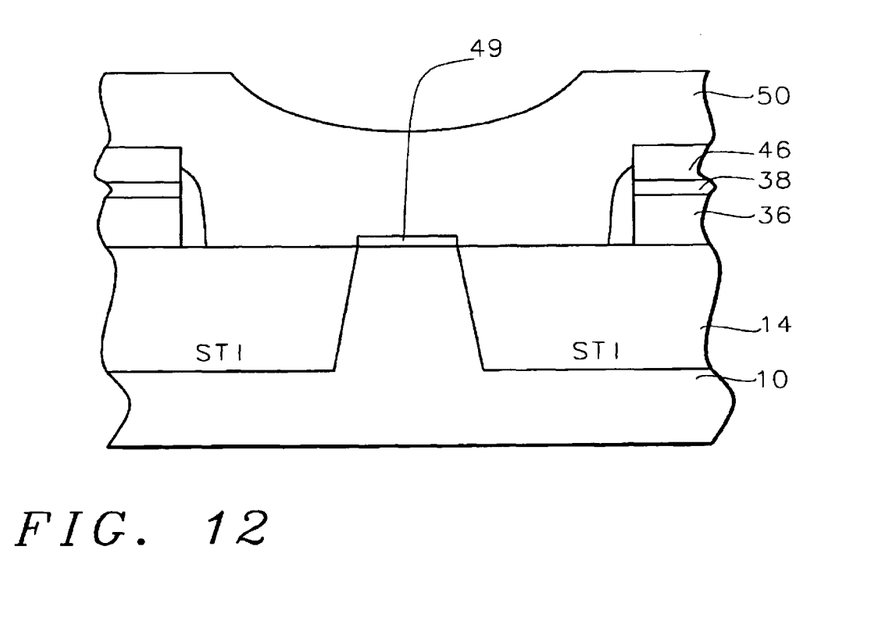
FIG. 12 is a cross-sectional representation of view C—C showing the elimination of stress-induced voids in a preferred embodiment of the present invention.
Figure 13:
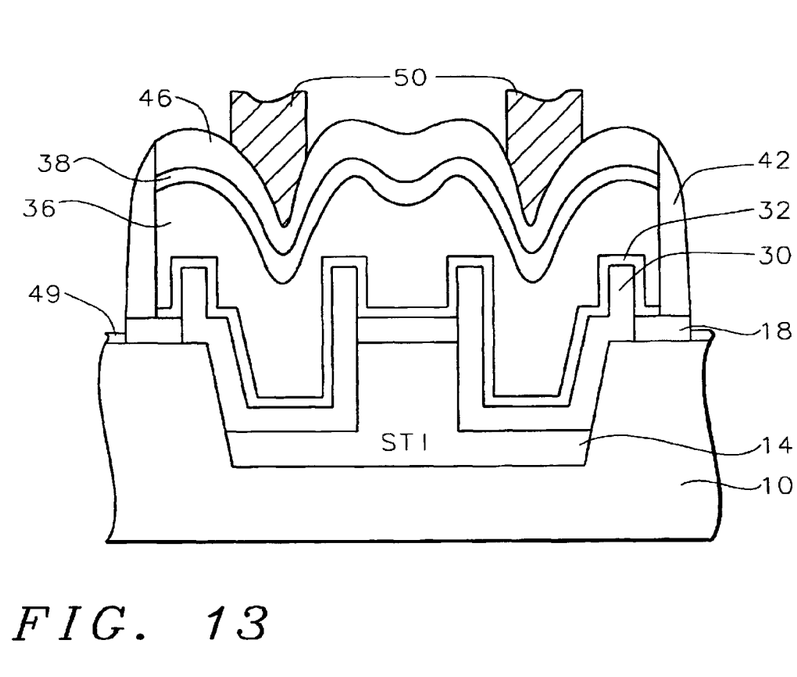
FIG. 13 is a cross-sectional representation of view A—A showing the elimination of stress-induced voids in a preferred embodiment of the present invention.

Now, the active areas are cleaned followed by gate oxide growth 49, as shown in FIGS. 11, 12, and 13. The gate transistor material, preferably polysilicon, is deposited and patterned as shown in top view in FIG. 9 and in cross-section A—A in FIG. 13 to form the transistor gates 50. FIG. 11 shows the cross-section across view B—B and FIG. 12 shows the cross-section across view C—C of FIG. 9. Gate oxide 49 is shown in FIGS. 11 and 12. During these high temperature steps of gate oxide growth and source/drain annealing, not shown, voids do not form in the process of the invention. Voids are eliminated because of the presence of the stress-balancing layer 38. The gate to gate and gate to top plate electrode isolation are improved by the stress-balancing layer. The inter-dielectric layer 38 must have a stress opposite to the intrinsic stress of the ARC layer.

The process of the present invention provides for the elimination of stress-induced voids by introducing a stress-balancing dielectric layer between the top electrode and the overlying ARC layer. The stress-balancing layer has a stress opposite to that of the overlying ARC layer. The presence of the ARC layer eliminates stress-induced voids and the resulting gate to gate or gate to top electrode shorting.

A 1T-RAM device of the present invention without stress-induced voids is shown in FIGS. 9, 11, 12, and 13. The device comprises a bottom electrode 30 of a capacitor formed lining trenches within shallow trench isolation regions 14 within a substrate, a capacitor dielectric layer 32 overlying the bottom electrode, and a top electrode layer 36 overlying the capacitor dielectric layer within and overlying the shallow trench isolation regions. A stress-balancing dielectric layer 38 overlies the top electrode of the capacitor. An anti-reflective coating (ARC) layer 46 overlies the stress-balancing layer. A gate oxide layer 49 overlies the substrate. Transistor gates 50 overlie the gate oxide layer 49 and the ARC layer 46 over the capacitor.

While the invention has been particularly shown and described with reference to the preferred embodiments thereof, it will be understood by those skilled in the art that various changes in form and details may be made without departing from the spirit and scope of the invention.

What is claimed is:

1. A method for fabricating an integrated circuit device comprising:

providing a stack of semiconductor materials overlying a substrate;

depositing a stress-balancing dielectric layer overlying said stack;

depositing an anti-reflective coating (ARC) layer overlying said stress-balancing layer;

thereafter patterning said stack to form first semiconductor device structures; and performing thermal processes to form second semiconductor device structures overlying said first semiconductor device structures wherein said stress-balancing layer prevents formation of stress-induced voids during said thermal processes.

2. The method according to claim 1 wherein said step of providing said stack of semiconductor materials comprises:

providing shallow trench isolation regions within said substrate;

etching trenches into said shallow trench isolation regions where capacitors are to be formed;

depositing a first conducting layer into said trenches and etching away said first conducting layer except where it lines said trenches to form bottom electrodes of said capacitors;

depositing a capacitor dielectric layer overlying said bottom electrodes; and depositing a top electrode layer overlying said capacitor dielectric layer.

3. The method according to claim 1 wherein said balancing dielectric layer has a stress opposite to said ARC layer's intrinsic stress.

4. The method according to claim 1 wherein said balancing dielectric layer comprises oxide, silicon nitride, or silicon oxynitride.

5. The method according to claim 1 wherein said ARC layer comprises silicon oxynitride deposited by plasma enhanced chemical vapor deposition (PECVD).

6. The method according to claim 1 wherein said ARC layer has an intrinsic tensile stress and wherein said stress-balancing layer has a compressive stress.

7. The method according to claim 1 wherein said ARC layer has an intrinsic compressive stress and wherein said stress-balancing layer has a tensile stress.

8. The method according to claim 1 wherein said first semiconductor devices are capacitors and wherein said second semiconductor devices are gate transistors.

9. The method according to claim 1 wherein said thermal processes comprise:

growing a gate oxide layer on said substrate; and annealing to drive in source and drain implantations.

10. The method according to claim 1 wherein said integrated circuit comprises a single transistor SRAM device.

11. A method for fabricating an integrated circuit device comprising:

providing a stack of semiconductor materials overlying a substrate;

depositing a stress-balancing dielectric layer overlying said stack wherein said stress-balancing layer has a compressive stress;

depositing an anti-reflective coating (ARC) layer overlying said stress-balancing layer wherein said ARC layer has an intrinsic tensile stress;

thereafter patterning said stack to form first semiconductor device structures; and performing thermal processes to form second semiconductor device structures overlying said first semiconductor device structures wherein said stress-balancing layer prevents formation of stress-induced voids during said thermal processes.

12. The method according to claim 11 wherein said step of providing said stack of semiconductor materials comprises:

providing shallow trench isolation regions within said substrate;

etching trenches into said shallow trench isolation regions where capacitors are to be formed;

depositing a first conducting layer into said trenches and etching away said first conducting layer except where it lines said trenches to form bottom electrodes of said capacitors;

depositing a capacitor dielectric layer overlying said bottom electrodes; and depositing a top electrode layer overlying said capacitor dielectric layer.

13. The method according to claim 11 wherein said balancing dielectric layer comprises oxide, silicon nitride, or silicon oxynitride.

14. The method according to claim 11 wherein said ARC layer comprises silicon oxynitride deposited by plasma enhanced chemical vapor deposition (PECVD).

15. The method according to claim 11 wherein said first semiconductor devices are capacitors and wherein said second semiconductor devices are gate transistors.

16. The method according to claim 11 wherein said thermal processes comprise:

growing a gate oxide layer on said substrate; and annealing to drive in source and drain implantations.

17. The method according to claim 11 wherein said integrated circuit comprises a single transistor SRAM device.

* * * * *